US00RE36208E

United States Patent [19]

Steffen

[11] E Patent Number: Re. 36,208

[45] Reissued Date of Patent: May 11, 1999

[54] HOUSING FOR CONTAINING A FRAGILE ELEMENT SUCH AS A LOGIC CIRCUIT

[75] Inventor: Francis Steffen, Aix Les Bains, France

[73] Assignee: SGS-Thomson Microelectronics S.A., Saint Genis, France

[21] Appl. No.: 08/230,809

[22] Filed: Apr. 21, 1994

Related U.S. Patent Documents

Reissue of:

[64] Patent No.: 5,107,073
Issued: Apr. 21, 1992
Appl. No.: 07/284,428
Filed: Dec. 14, 1998

[30] Foreign Application Priority Data

Jan. 13, 1988 [FR] France ..... 88 00462

[51] Int. Cl.[6] ..... H05K 5/00; H05K 1/14

[52] U.S. Cl. ..... 174/52.1; 150/131; 150/147; 206/449; 220/4.02; 361/684; 361/737

[58] Field of Search ..... 174/52.1, 52.3, 174/52.2; 150/131, 144, 147; 206/39, 39.1, 39.7, 449, 454; 220/4.01, 4.02; 361/684, 737

[56] References Cited

U.S. PATENT DOCUMENTS 4,141,400 2/1979 Mangan ..... 150/39
4,450,024 5/1984 Haghiri-Tehrani et al. .
4,589,547 5/1986 Stewart et al. ..... 206/328
4,617,216 10/1986 Haghiri-Tehrani et al. .
4,758,689 7/1988 Nakao et al. .
4,852,736 8/1989 Kojima et al. ..... 206/328
4,918,299 4/1990 Ohmori ..... 235/488

FOREIGN PATENT DOCUMENTS 0233649 8/1987 European Pat. Off. .

*Primary Examiner*—Bot L. Ledynh
*Attorney, Agent, or Firm*—Wolf, Greenfield & Sacks, P.C.

[57] ABSTRACT

A housing designed to contain a logic circuit (15) comprising two shells (11a, 11b) each including a welding area (17a, 17b) having an appropriate geometry permitting ultrasonic welding, such that when both shells are assembled before a welding phase, they are shifted along a vertical axis (20). The supporting plate (13) comprises a mounting ear (23) while the shells comprise a receptacle (33a, 33b). During the welding phase, there is no concomitant contact between any of the upper face (26) and lower face (27) of the ear (23) and the corresponding bearing faces (34a, 34b) of the receptacles, owing to a shift (21). The shift is reduced and the concomitant contact takes place between the bearing faces (34a, 34b) of the receptacles and each of the upper and lower faces (26, 27) of the ear (23) only when the welding phase is completed.

19 Claims, 2 Drawing Sheets

HOUSING FOR CONTAINING A FRAGILE ELEMENT SUCH AS A LOGIC CIRCUIT

Matter enclosed in heavy brackets [ ] appears in the original patent but forms no part of this reissue specification; matter printed in italics indicates the additions made by reissue.

BACKGROUND OF THE INVENTION

This invention provides a housing designed to contain at least one fragile element, such as a logic circuit and to a process for providing an assembly process for such a housing.

More particularly, this invention relates to a housing exhibiting the shape of a credit card and is in the spirit of the expansion of logic circuit cards liable to fulfil several functions such as access cards to controlled areas, bank cards or others.

FIELD OF THE PRIOR ART

Generally, the housings according to the invention comprise two shells and a supporting plate designed to carry a logic circuit. As regards the specific expansion also aimed at by the instant invention, the housing exhibits the shape of two generally plane shells, exhibiting, generally, the shape of a credit card, while the supporting plate also includes a connector designed for permitting the connection of the card logic to an external logic circuit, the shells and the supporting plate are preferably made of plastics.

The general technical problem which was encountered by the Applicant is that of the final assembly of the shells and supporting plate.

Various solutions are known. They all resort to adhesive-bonding techniques implementing either adhesive or adhesive-coated films. Those techniques present various drawbacks.

First, the adhesive efficiency is not always satisfactory since the materials to be brought together are not always clean and perfectly plane. Effectively, the adhesive bonding depends upon the surface energy of the adhesive and that of the materials to be bonded by adhesive. The adhesive surface energy is usually constant; but, that of the materials to be bonded by adhesive is liable to change from one manufacturing batch to another. It is therefore rather difficult to reproduce from one batch to another similar adhesive bonding conditions, what requires a specific processing of the batches and, in addition to the economical drawbacks, renders the adhesive bonding characteristics hazardous.

Another drawback is that bonding by means of adhesive can be easily damaged especially when the card is submitted to large temperature variations. In this respect, the cards aimed at by the instant invention have to be capable of withstanding temperature variations of about 100° C. Similarly, the cards according to the invention have to be capable of withstanding large mechanical stresses. Since, in addition, the various adhesives which are marketed have their own advantages and drawbacks, it is often difficult to comply with the multiple requirements imposed by the specifications sheet as, for example, low temperature resistance, bending strength, resistance to solvents, to pollution, etc.

Finally, the adhesive implementation is not in any case easy. Indeed, those skilled in the art are faced with pollution problems as regards components or mankind. They are also faced with adhesive bonding time problems which are not always easy to control in an assembly line. Ultrasonic welding is also known.

This technique, which permits bringing together of plastic elements by fusing the material at the connection point, eliminates some of the drawbacks hereinabove mentioned. However, as regards the assembly of a housing containing a fragile logic circuit, and more particularly when said housing exhibits the general shape of a relatively thin credit card, those skilled in the art cannot, in the present state of the technique, consider to use an ultrasonic welding method.

The basis of the method is to set in vibration, at an ultrasonic frequency (in the range of 20 to 50 KHz) the welding area, in the present application, the periphery of the plane housing. Therefore, in case one would resort to such an assembly method according to the known techniques, the vibrations would be transmitted to the whole housing. Regarding the present application relative to the assembly of two plane shells between which a logic circuit is sandwiched, the vibrations would be transmitted to the logic circuit, what would practically result in the destruction of the fragile elements included in this circuit. This would also be true in case the supporting plate of the circuit includes a connector. Numerous welding connections are then provided between the logic circuit elements and conductor pins, those weldings being exposed to be destroyed or, at least damaged, in case they would be submitted, even for a very short lapse of time, to vibrations of the hereinabove mentioned type.

This is the reason why, in a first step, the Applicant has conducted exhaustive studies in the field of adhesive-bonding techniques. However, in spite of the fact that, for those skilled in the art, the ultrasonic welding method seemed to be utterly improper to solve the assembly problem for the reasons that have been disclosed hereinabove, the Applicant has undertaken studying a solution permitting to obtain the assembly by means of ultrasonic welding, while preventing as far as possible the ultrasonic vibrations having a damaging amplitude from being transmitted to the fragile elements which must be contained in the housing, whether they are certain logic circuit elements, weld seams of the connector or any other fragile element. At the same time, the Applicant has continued its experimentations for improvingly complying with the technical characteristics imposed by the specifications sheet as regards the logic circuit carrier cards, especially their bending capacity.

The instant invention provides for a solution to this double technical problem since it aims at providing a housing designed to contain, especially, at least one fragile element such as a logic circuit, comprising at least two shells which have to be assembled by means of ultrasonic welding, each shell comprising for this purpose at least one welding area, having an appropriate geometry for permitting the ultrasonic welding, and being such that when both shells are assembled, before the welding phase, a shift directed along a first axis, called vertical axis, generally separates the shells. The fragile element is mounted on at least one supporting plate comprising at least a mounting portion while one at least of the shells comprises a receptacle for this portion, the shells, said receptacle and mounting portion cooperating so that, on the one hand, the movement of the supporting plate along both axes, respectively called transversal and axial axes, is limited respectively to a transversal and axial clearance and, on the other hand, after the welding phase, the movement of the supporting plate, along the vertical axis, is limited to a vertical clearance.

The instant invention also aims at providing for a housing assembly method such as the one succinctly described hereinabove, consisting in:

preassembling both shells and the supporting plate, pressing the shells together by means, in particular, of an ultrasonic welding device, setting the welding area in vibration by means of a welding device by directing the ultrasonic vibrations according to said vertical axis, stopping the vibrations as soon as said shift according to the vertical axis is cancelled.

Owing to those arrangements, a housing is carried out, containing at least one fragile element which can be assembled by means of ultrasonic welding. Thereby, the drawbacks inherent to the "adhesive-bonding" type techniques are eliminated. Moreover, as regards the credit card-shaped housing developed by the Applicant, the requirements imposed by the specifications sheet are better complied with.

Therefore, as regards the resistance of the whole set to the ultrasonic vibrations, during the welding phase, it must be noted that owing to the shift between the shells at the beginning of the welding phase according to a so-called vertical axis, parallel to the amplitude of the vibrations, one prevents them from being directly transmitted to the supporting plate and, therefore, to the fragile elements carried by said plate.

It will be further noted that the mounting portion of the supporting plate is imbedded and not welded in the receptacle. Moreover, at least in some applications, a slight clearance is provided so that the mounting portion of the supporting plate is liable to move towards various directions inside the receptacle, during and after the welding phase. The advantage of those arrangements is to further reduce the transmission points of the vibrations between the shells and the assembly portion. It is easy to understand that if one can avoid blocking, by a clearance-free imbedding, the mounting portion of the supporting plate, one avoids at the same time to get the vibrations transmitted directly or indirectly through the imbedding means.

On the other hand, according to the invention, a homogeneous housing comprising no foreign elements and no interfaces between the shells is carried out. Such a housing functions in an homogeneous manner under various atmospheric or climatic conditions. Thus, the assembly process permits to extend the resistance of the card-shaped housing whether by low or by high temperatures, the storage range increasing from −40° C., +85° C. according to the prior art techniques to −55° C., +150° C. or even more if necessary, in accordance with the materials used. Moreover, if it is deemed desirable, a real airtight ability of the card is obtained after welding.

Another advantage of the invention is the presence of a slight clearance after the welding phase, especially in a vertical direction but also, when it is possible, in the axial and transversal directions. This clearance permits, as regards the housing exhibiting the general shape of a credit card, to improve the ability of the housing to withstand bendings. Indeed, when the housing is submitted to a flexion, the logic circuit, which most frequently exhibits the shape of a small plane printed circuit, can shift within determined directions, thus compensating for at least a portion of the bending.

The manufacturing problems hereinabove mentioned are then solved since the assembly process is clean and rapid, non-pollutive, and the assembly conditions are reproducible, without hazard.

Finally, the above mentioned advantages have a major financial repercussion since the manufacturing time (the welding phase lasts only a few milliseconds), the automatization and, in a general manner, the ease of the method, permit to optimize the costs.

In some applications, it is not desirable, once the whole set has been assembled and welded, that the supporting plate be capable of moving towards one or several directions. That is the reason why, in some applications of the invention, one at least of the transversal, axial and vertical clearances is null. However, according to the invention, the vertical clearance can be cancelled only once the welding phase is completed, in order to avoid that the ultrasonic vibrations be directly transmitted to the supporting plate during the welding phase.

In a preferred embodiment, the mounting portion comprises a mounting ear, roughly parallel-epipedic, generally extending according to a transversal-axial plane, while the receptacle has a similar shape, the relative size of the supporting plate, mounting ear and receptacle being such that, on the one hand, the height of the ear is at least equal to the total height of the receptacle of this ear once the housing is assembled and welded and, on the other hand, since the ear comprises, at its transversal end closest to the welding area, a lateral face positioned according to an axial-vertical plane, no contact is possible between this lateral face and the corresponding face of the receptacle.

Those arrangements are particularly simple to implement and moreover the vibrations cannot be transmitted either directly or indirectly by said lateral face.

According to another characteristic of this preferred embodiment, each shell comprises a notch adapted to receive the supporting plate, while the latter comprises two mounting portions, each of those mounting portions being associated with an end lateral face of the supporting plate, the notch comprising itself two corresponding lateral faces, the relative size of the notch and of the supporting plate is such that no concomitant contact is possible between each other, since the end lateral faces of the supporting plate cannot be simultaneously in contact with the corresponding faces of the notch.

Those arrangements permit to especially avoid, during the welding phase, that the supporting plate get imbedded and blocked in a transversal direction and therefore that the vibrations be transmitted more or less indirectly to the supporting plate by means of its end lateral faces.

In this embodiment, the supporting plate is blocked in the axial direction, each of the mounting ears exhibiting a front face and a rear face extending according to a vertical-transversal plane and abutting against the corresponding faces included in the receptacles. Thus, the vibrations possible transmitted by those faces mainly radiate according to an axial direction and are therefore substantially damped in the transversal direction towards the inner part of the supporting plate.

Advantageously, the edges of the mounting ear are rounded up, which permits to especially avoid the peak effects and to further increase the damping of the vibrations.

In this preferred embodiment, according to a particularly advantageous characteristic, the shells, on the one hand, and the mounting portion, on the other hand, are manufactured from distinct materials not liable to get amalgamated during an ultrasonic welding operation.

Thus, one prevents the mounting portion from getting accidentally welded in the receptacle, which permits, on the one hand, to avoid transmitting the vibrations through this accidental welding before the welding phase is completed and, on the other hand, to avoid blocking the supporting plate when, for certain applications, it is desirable that the latter be able to move towards one or several directions, as hereinabove explained.

BRIEF DESCRIPTION OF THE DRAWINGS

These and other objects, features and advantages of the instant invention will clearly appear from the following detailed description of preferred embodiments, in connection with the attached drawings, wherein.

DETAILED DESCRIPTION OF THE DRAWINGS

Figure 1:
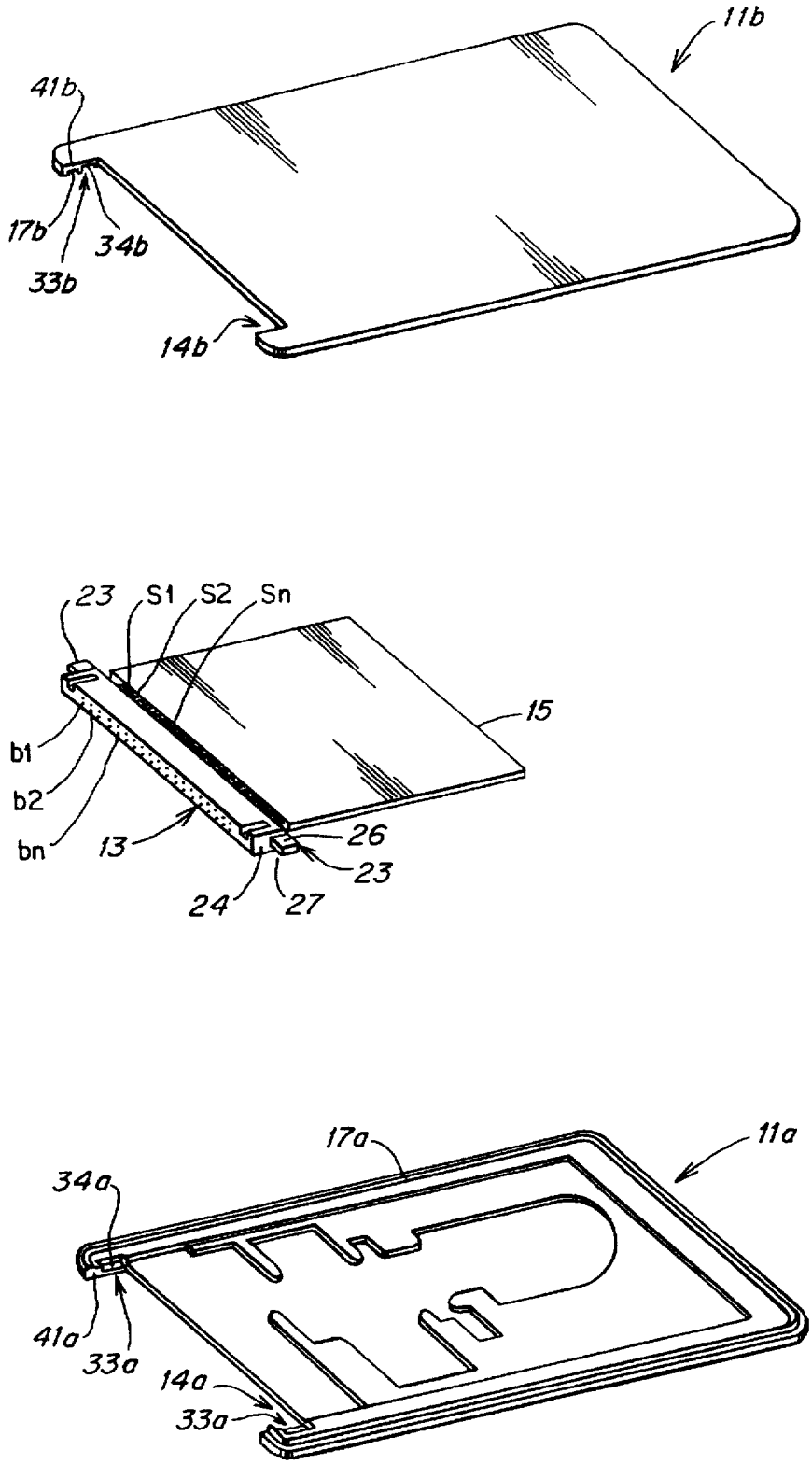
FIG. 1 is a perspective exploded view of an embodiment of a housing according to the invention.

According to the embodiment shown in FIGS. 1 to 4, a housing 10 comprises two shells, a lower one, 11a, and an upper one, 11b, and a supporting plate 13, carrying a logic circuit, here shown in the shape of a printed circuit 15. The shells 11a, 11b, are generally plane and their length and width correspond to the standard of the credit cards.

Each shell comprises, on one of its smaller sides, a receptacle 14a (14b), the shape of which is substantially rectangular, each of those receptacles being adapted to receive the supporting plate 13 which protrudes outside of the shells in this embodiment. The supporting plate 13 also incorporates a connector, here comprising female plugs referenced b1, b2 on the drawing. In the present embodiment, it is the function of the weld seams S1, S2, . . . Sn connecting the pins to the circuit 15 to ensure the connection between the circuit 15 and the supporting plate 13.

The instant invention relates to the mounting of the shells and the supporting plate.

For this purpose, each shell comprises a welding area (17a, 17b), having an appropriate geometry for permitting the ultrasonic welding.

Figure 2:
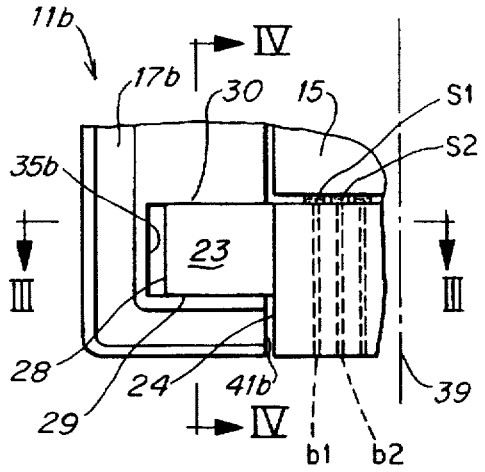
FIG. 2 is a detailed section view of one of the shells and mounting portion of the supporting plate illustrated in FIG. 1, according to the line II—II of FIG 3.
Figure 3:
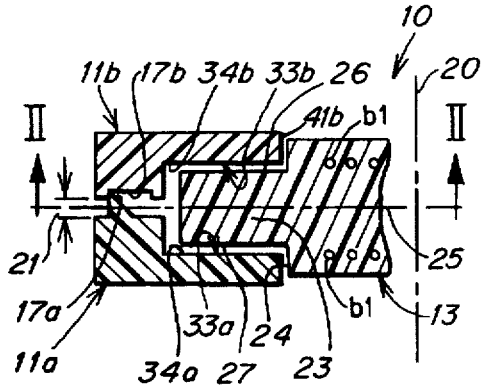
FIG. 3 is a partial section view according to the line III—III of FIG. 2, the shells being preassembled before welding.

In the described embodiment, the shells being manufactured from ABS, this welding area exhibits, on each of the shells 11a, 11b, a specific section designed to permit and to facilitate this welding. On the lower shell 11a, the welding area 17a exhibits the shape of a sharp edge, while on the upper shell, the welding area 17b presents the shape of a depression exhibiting a substantially rectangular section (FIGS. 2 and 3). Those areas 17a, 17b extend along the periphery of the shell, except for the sides forming the notches 14a, 14b.

The geometry of the welding areas 17a, 17b can clearly be seen in FIG. 3. According to a characteristic of the invention, the geometry of the welding area of each of the shells is such that when both shells are assembled, before the welding phase, as shown in FIG. 2, they are shifted along a first, so-called "vertical", axis, here referenced 20. The shift of both shells is referenced 21 in FIG. 3.

The geometry of the welding area 17a, 17b illustrated in FIGS. 1 to 3 is not the only possibility. Indeed, this shape depends, on the one hand, upon the material used (in the present embodiment, ABS) and, on the other hand, upon the size of the parts to be welded. Those skilled in the art, who know the ultrasonic welding, will be able to determine the shape of the welding area to be adopted for each case. However, according to the invention, the adopted shape has to be designed so as to generate a shift along the axis 20 of both half shells, at least at the mounting area of the supporting plate, as it will be apparent from the description thereof which is made hereinafter.

Figure 7:
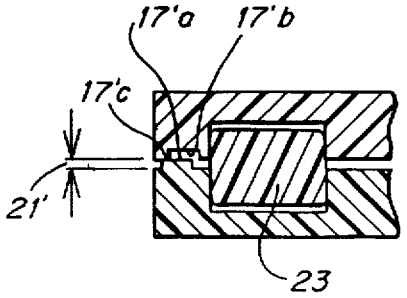
FIG. 7 is a view corresponding to FIG. 3 and illustrates an alternative implementation.

By way of example, FIG. 7 shows another shape that can be used if the shells are fabricated with nylon. It is noticeable that the welding areas 17'a, 17'b exhibit a L-section but that at the start of the welding phase an overlapping 17'c of the material generates a shift 21'.

According to the invention, the supporting plate 13 comprises at least one mounting area. In the embodiment herein chosen and illustrated, the mounting area is essentially constituted by a "mounting" ear, referenced 23 in FIGS. 1 to 4. FIG. 1 shows that the supporting plate 13 comprises an end lateral ear. Those ears are all identical and only the left one, shown in detail in FIGS. 2 to 4, will be described.

The mounting ear 23 is molded integral with the supporting plate 13. It exhibits a general parallel-epipedic shape and is positioned on each end lateral face 24 of the supporting plate 13, substantially according to a mid-plane schematized in FIG. 3 by the transversal axis 25.

The ear 23 comprises five external faces: an upper face 26, a lower face 27, a lateral face 28, a front face 29 and a rear face 30.

The upper face 26 and the lower face 27 are generally plane and extend according to planes that are parallel to those of the shells 11a and 11b. The lateral face 28 extends according to a plane substantially vertical, parallel to the axis 20. It is also parallel to the longitudinal edges of the shells. The front face 29 and rear face 30 are positioned vertically and perpendicularly with respect to the hereinabove described faces.

According to the invention, at least one of the shells 11a, 11b comprises a receptacle for the mounting portion.

In the embodiment chosen and illustrated here, each shell comprises such a receptacle (references 33a, 33b). Each of the receptacles 33a, 33b comprises a horizontal bearing face 34a, (34b), a lateral face 35a (35b), a vertically extending front face 36a, (36b) and a vertically extending rear face 37a, (37b).

Figure 4:
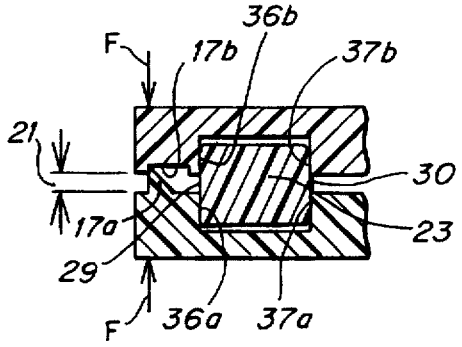
FIG. 4 is a partial section view according to the line IV—IV of FIG. 2, the shells being preassembled before welding.

According to an aspect of the invention implemented in the described embodiment, FIGS. 2 and 4 show that the distance separating the front face 29 and rear face 30 from the ear 23 is the same as the one separating the front face 36a, 36b and the rear face 37a, 37b from the receptacles 33a, 33b, so that, according to a characteristic of an aspect of the invention implemented in this embodiment, the supporting plate 13 is blocked in the axial direction (schematized in FIG. 2 by the axis 39).

According to another aspect of the invention, the ears 23 exhibit a lateral extension (according to the transversal axis 25), substantially lower than the lateral extension of the receptacles 33a, 33b. Similarly, the length of the supporting plate 13, between its end lateral faces 24, is substantially smaller than the distance between the lateral faces 41a, 41b of the notch 14: thus, whether the housing is simply assembled before the welding phase (FIG. 3) or whether it is welded (FIG. 6), the supporting plate 13 is capable of moving transversally (according to the axis 25), and its movement is limited by the abutment of the supporting plate faces 24 against the lateral faces 41a, 41b of the notch.

It will be therefore noted, in the embodiment herein described and illustrated, and according to a particularly advantageous feature of an aspect of the invention, on the one hand, that no contact is possible between the lateral face 28 of the ear 23 and the lateral face 35a or 35b of the receptacle 33a or 33b and, on the other hand, that the supporting plate 13 cannot get into contact with the shells 11a, 11b simultaneously by means of each of its lateral faces 24.

Figure 6:
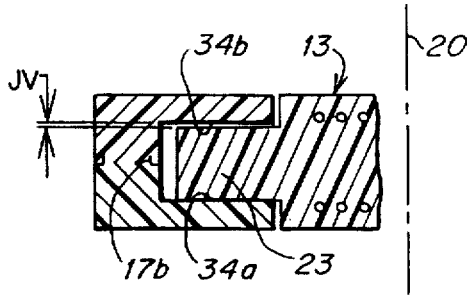
FIG. 6 is a view similar to FIG. 3 but illustrates the whole set after welding.

According to the invention, the thickness of the ear 23, that is, the distance separating its upper face 26 and lower face 27 is at least equal to the distance separating its bearing horizontal faces 34a, 34b from the receptacles 33a, 33b when the shells are welded. In that case, when the welding phase is completed, there is a simultaneous contact between the upper face 26 and lower face 27 of the ear 23 respectively with the bearing face 34a of the lower shell 11a and the bearing face 34b of the upper shell 11b. However, according to the embodiment chosen and illustrated here, the thickness of the ear 23 is chosen so as to be substantially smaller than the distance separating the horizontal faces 34a, 34b, once the welding is completed (FIG. 6). Thus, once the shells have been welded, the supporting plate 13 is movable along the vertical axis 20 but it is limited to the clearance JV illustrated in FIG. 6.

The assembly process will now be described.

First, as shown in FIGS. 3 and 4, one preassembles the shells 11a, 11b and the supporting plate 13 on which the circuit 15 has been mounted beforehand.

Then, in a way known per se, the shells 11a, 11b are positioned between a supporting plate and a sonotrode so that a pressure is applied onto the shells, this pressure being schematized in FIG. 4 by the arrows F. As shown in FIGS. 3 and 4, at the beginning of the welding phase, while the shells are assembled, the shells 11a, 11b are separated by the shift 21. As a result, even though the thickness of the ear 23 is substantially equal to the height of the whole receptacle 33a, 33b after welding, at the beginning of the welding phase, there is a vertical clearance at least equal to the shift 21 and the supporting plate can move according to the vertical axis within the limits of this clearance.

As already disclosed, a transversal clearance is provided so that the lateral faces 24 of the supporting plate cannot get simultaneously in contact with the lateral faces 41a, 41b of the notches 14a, 14b. Moreover, no contact is possible between the lateral face 28 of the ear and the lateral faces 35a and 35b of the receptacles 33a, 33b.

The sonotrode is then set in vibration. According to a characteristic of this method, the vibrations are directed according to a vertical plane (parallel to the axis 20). Therefore, the vibrations cannot be directly transmitted to the upper face 26 and lower face 27 of the ear 23 since said ear is not pinched between the shells. Similarly, for the reasons mentioned hereinabove, none of the vibrations can be transmitted either by the lateral face 28 of the ear 23 or by the lateral faces 24 of the supporting plate.

Thus, according to the implementation that is being described, at the beginning of the welding phase, only the front face 29 and the rear face 30 of the ear 23 are in contact with the corresponding faces of the receptacle 33a or 33b (FIGS. 2 and 4). But, since the amplitude of the vibrations extend parallel to those faces and, in addition, since those vibrations are in register one with respect to the other, the vibrations transmitted by those faces are essentially propagated towards an axial direction and substantially not towards a transversal direction.

Figure 5:
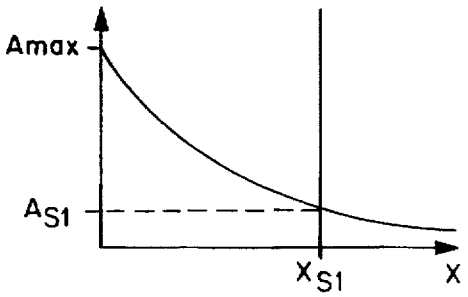
FIG. 5 is a diagram showing the damping of the vibrations transmitted to the supporting plate during the welding phase.

In FIG. 5, the diagram shows the amplitude of the vibrations at the welding seam 17a, 17b and the value of this amplitude as a function of the distance according to a transversal direction with respect to the area 17a, 17b. In the area S1, the first welding (X-axis $x_{S1}$ in FIG. 5), the amplitude of the vibrations is substantially damped (amplitude $A_{S1}$). Effectively, the Applicant has noticed that there is in $x_{S1}$ a damping of about 40 dB with respect to the amplitude $A_{max}$ of the vibrations in the welding region. Such a damping is sufficient in the present implementation to avoid damaging the welding S1. However, it is noticeable that the farther one gets from the welding area, the higher the damping is. In case elements still more fragile are to be assembled in a printed circuit, it will be sufficient, according to the embodiment herein described, to position them in a place where the damping is still more important.

The ultrasonic vibrations are applied for a relatively short time period (here, about a few tenths of a second). The vibration energy gets concentrated on the edge 17a, in a well known manner, what causes the fusion of the material of this edge with the area 17b of the upper shell. Since a vertical pressure F is applied onto the shells, they get closer, the shift 21 decreases and is then cancelled.

At the end of the welding phase, the welding edge 17a of the lower shell 11a is entirely fused and the material that constituted this edge is engaged into the notch of the welding area 17b, as illustrated in FIG. 6.

According to an advantageous characteristic of the invention such as implemented in the present case, the vibrations are stopped as soon as the shift 21 is cancelled. Owing to this arrangement, in case the thickness of the ear 23 is equal to the height of the whole receptacle set 33a, 33b after the welding phase, one avoids transmitting, even for a very short lapse of time, vibrations having an amplitude $A_{max}$ to the mounting ears 23 and to the supporting plate 13–circuit 15 set.

It is possible to further decrease the amplitude of the vibrations at the fragile elements.

A first solution consists in suppressing the pinch of the ear 23 by its front and rear faces 29, 30, illustrated in FIGS. 2 and 4. It will then be possible to provide a slight axial clearance. However, later on, such a clearance may prove to be damaging since the supporting plate 13 is then allowed to slightly rotate according to a horizontal plane, what, in some implementations, may render it inappropriate to function as a connector. Therefore, in the embodiment chosen and described here, it has been deemed more advisable to maintain a contact between the front face 29 and the rear face 30 of the ear 23 and the corresponding faces of the receptacles 33a, 33b.

As illustrated in the figures, it is also possible to provide a rounding of the horizontal edges of the ear 23. Owing to this arrangement, the peak effect is then avoided, that is, the energy concentration on those edges, and a radiation of this energy towards the inner part of the supporting plate when, for example, there is a contact between the lower face 27 of the ear 23 and the bearing face 34a of the receptacle 33a of the lower shell 11a.

Moreover, in the embodiment chosen and illustrated here, according to an advantageous characteristic of an aspect of the invention, the supporting plate, as well as the mounting ear 23, is molded out of nylon, this material being unlikely to get amalgamated with the ABS during the welding phase. One therefore avoids to get the supporting plate 13 blocked in position, what permits to maintain the free movement of the supporting plate after the welding phase, according to vertical and transversal axes. Moreover, one avoids that, by carrying out a microwelding on the front face 29 or rear face 30 and therefore blocking the supporting plate, the vibrations get transmitted with a high amplitude towards the fragile elements carried by the supporting plate 13.

It will be noted on the other hand that leaving a slight clearance in the vertical and transversal directions permits to improve the ability of the card to withstand bending stresses. Indeed, if the card is substantially bent, the whole circuit is able to move, within the above mentioned clearance limits, to compensate as much as possible for the bending.

Of course, the instant invention, herein described in connection with a preferred embodiment, is liable of numerous variations without departing from its scope.

It is to be noted in particular that the invention is in no way limited to thin housings such as the one hereinabove described, but includes on the contrary any type of housings designed for containing at least one fragile element that it is desirable to assemble by means of a welding method implementing vibrations having damaging amplitude for the fragile element.

Similarly, the instant invention is not limited to housings comprising an apparent connector. Particularly, the invention can apply to a logic circuit carrier card comprising connection means of the electromagnetic type. In such a case, as in any case when the connections are not apparent, the invention permits to obtain such a card which has the advantage of being fully airtight in addition to all the advantages hereinabove mentioned.

I claim:

1. A housing, suitable for containing at least one fragile element such as a logic circuit, comprising:

two shells assembled by ultrasonic welding, each shell comprising at least one welding area having a form permitting ultrasonic welding and being such that when both shells are assembled before welding a shift directed along a vertical axis separates the shells; and at least one supporting plate for supporting a fragile element, said supporting plate comprising at least one mounting portion, wherein at least one of the shells comprises a receptacle for said mounting portion of the corresponding shell, and receptacle and said mounting portion cooperating so that a movement of the supporting plate along transverse and axial axes is limited to respective transverse and axial clearances and movement of the supporting plate of said two shells after welding along the vertical axis is limited to a vertical clearance (JV).

2. A housing according to claim 1, wherein;

at least one of said transverse and axial clearances is reduced to zero by said assembly and welding.

3. A housing according to claim 1, wherein:

the mounting portion comprises a substantially parallelpipedic mounting ear extending in a transverse-axial plane, the receptacle has a similar parallelpipedic shape, the relative sizes of the supporting plate, the mounting ear and the receptacle being such that the height of the ear is not greater than the total height of the receptacle once the housing is assembled and welded, the ear comprising on a transverse end adjacent the welding area a lateral face positioned in an axial-vertical plane with no contact possible between said lateral face and a corresponding face of the receptacle.

4. A housing according to claim 1, wherein:

a supporting plate is engaged in at least one notch in at least one of said shells, two mounting portions being provided, each mounting portion being associated with an end lateral face of a supporting plate, and said at least one notch comprises two corresponding lateral faces, the relative size of the notch and of the supporting plate being such that contact is prevented between said notch and said supporting plate, the end lateral faces of the supporting plate being denied simultaneous contact with corresponding faces of the notch.

5. A housing according to claim 1, wherein:

the mounting portion comprises a selected number of rounded edges.

6. A housing according to claim 1, wherein:

the shells and the mounting portion are manufactured from respective materials not liable to become amalgamated during ultrasonic welding of said at least two shells.

*7. A housing according to claim 1, wherein said housing has a square shape in the transverse-axial plane.*

*8. A housing according to claim 1, wherein said housing has a rectangular shape in the transverse-axial plane.*

*9. A housing according to claim 1, further comprising a connector connected to said fragile element for releasably connecting said fragile element to an external circuit.*

*10. A housing according to claim 9, wherein said connector is attached to said supporting plate.*

*11. A housing, suitable for containing at least one fragile element such as a logic circuit, comprising:*

*two shells assembled by welding, each shell comprising at least one welding area having a form permitting welding and being such that when both shells are assembled before welding a shift directed along a vertical axis separates the shells; and*

*at least one supporting plate for supporting a fragile element, said supporting plate comprising at least one mounting portion,*

*wherein at least one of the shells comprises a receptacle for said mounting portion of the corresponding shell, said receptacle and said mounting portion cooperating so that a movement of the supporting plate along transverse and axial axes is limited to respective transverse and axial clearances and movement of the supporting plate of said two shells after welding along the vertical axis is limited to a vertical clearance (JV).*

*12. A housing according to claim 11, wherein:*

*the shells and the mounting portion are manufactured from respective materials not liable to be come amalgamated during welding of said two shells.*

*13. A housing according to claim 11, wherein said welding is ultrasonic welding.*

*14. A housing according to claim 13, wherein said shells are formed of ABS.*

*15. A housing according to claim 13, wherein said shells are formed of nylon.*

*16. A housing according to claim 13, wherein said shells are formed of ABS, and wherein said mounting portion is formed of nylon.*

*17. A housing comprising:*

*two shells assembled by welding, each shell comprising at least one welding area having a form permitting weld-*

*ing and being such that when both shells are assembled before welding a shift directed along a vertical axis separates the shells; and*

*at least one supporting plate including at least one mounting portion,*

*wherein at least one of the shells comprises a receptacle for said mounting portion of the corresponding shell, said receptacle and said mounting portion cooperating so that a movement of the supporting plate along transverse and axial axes is limited to respective transverse and axial clearances and movement of the supporting plate of said two shells after welding along the vertical axis is limited to a vertical clearance (JV).*

*18. A housing according to claim 17, wherein:*

*the shells and the mounting portion are manufactured from respective materials not liable to be come amalgamated during welding of said two shells.*

*19. A housing according to claim 17, wherein said welding is ultrasonic welding.*

* * * * *